US012800686B2

(12) United States Patent
Miraux et al.

(10) Patent No.: US 12,800,686 B2
(45) Date of Patent: Nov. 17, 2026

(54) LOW FIELD MAGNETIC RESONANCE IMAGING INSTRUMENTAL SYSTEM AND METHODS OF USE

(71) Applicants: CENTRE NATIONAL DE LA RECHERCHE SCIENTIFIQUE, Paris (FR); UNIVERSITÉ DE BORDEAUX, Bordeaux (FR); PURE DEVICES GMBH, Rimpar (DE); STELAR S.R.L., Mede (IT)

(72) Inventors: Sylvain Miraux, Merignac (FR); Jean-Michel Franconi, Merignac (FR); Philippe Massot, Pessac (FR); Florian Fidler, Würzburg (DE); Stefan Wintzheimer, Retzstadt (DE); Gianni Ferrante, Mede (IT)

(73) Assignees: CENTRE NATIONAL DE LA RECHERCHE SCIENTIFIQUE, Paris (FR); UNIVERSITE DE BORDEAUX, Bordeaux (FR); PURE DEVICES GMBH, Rimpar (DE); STELAR S.R.L., Mede (IT)

( * ) Notice: Subject to any disclaimer, the term of this patent is extended or adjusted under 35 U.S.C. 154(b) by 144 days.

(21) Appl. No.: 18/847,740

(22) PCT Filed: Mar. 17, 2023

(86) PCT No.: PCT/EP2023/056859

§ 371 (c)(1),
(2) Date: Sep. 17, 2024

(87) PCT Pub. No.: WO2023/175128

PCT Pub. Date: Sep. 21, 2023

(65) Prior Publication Data

US 2025/0199100 A1 Jun. 19, 2025

(30) Foreign Application Priority Data

Mar. 17, 2022 (EP) .................................... 22305315

(51) Int. Cl.
*G01R 33/44* (2006.01)
*G01R 33/34* (2006.01)
*G01R 33/60* (2006.01)

(52) U.S. Cl.
CPC ..... *G01R 33/445* (2013.01); *G01R 33/34061* (2013.01); *G01R 33/60* (2013.01)

(58) Field of Classification Search
CPC ........... G01R 33/445; G01R 33/34061; G01R 33/60; G01R 33/62; G01R 33/381
See application file for complete search history.

(56) References Cited

U.S. PATENT DOCUMENTS 5,023,555 A * 6/1991 Ehnholm ............. G01R 33/445 324/318
2007/0273374 A1* 11/2007 Haase .................... G01R 33/46 324/309
2021/0278492 A1* 9/2021 Grodzki ............ G01R 33/4831

OTHER PUBLICATIONS

International Search Report and Written Opinion issued on Jun. 13, 2023, in corresponding International Application No. PCT/EP2023/056859, 10 pages.

(Continued)

*Primary Examiner* — Rishi R Patel
(74) *Attorney, Agent, or Firm* — Maier & Maier, PLLC

(57) ABSTRACT

A low field MRI instrumental system includes: an electromagnetic Radio Frequency antenna to emit RF pulses for inducing Electron Paramagnetic Resonance; an electromagnetic Low Frequency antenna for measurements, to emit LF pulses for inducing Nuclear Magnetic Resonance, respectively to receive LF signal produce by NMR; a gradient generator, to create a gradient in a static magnetic field generated during measurements; a high field generator to (Continued)

generate a strong pre-polarization magnetic field for magnetic pre-polarization; and, a control/command unit. This low field MRI instrumental system further includes a low field unit to generate a low static magnetic field whose direction is adjustable along the three directions X, Y and Z of a fixed reference frame associated with the low field MRI instrumental system.

10 Claims, 5 Drawing Sheets

(56) References Cited

OTHER PUBLICATIONS

Espy et al., "Squid-detected ultra-low field MRI", Journal of Magnetic Resonance, Academic Press, Orlando, FL, US, (Feb. 15, 2013), vol. 229, doi: 10.1016/J.JMR.2013.02.009, ISSN 1090-7807, pp. 127-141.
Hilschenz et al., "Dynamic nuclear polarisation of liquids at one microtesla using circularly polarised RF with application to millimetre resolution MRI", Journal of Magnetic Resonance, Academic Press, Orlando, FL, US, vol. 305, doi: 10.1016/J.JMR.2019.06.013, ISSN 1090-7807, (Jun. 29, 2019), pp. 138-145.
Lurie et al., "Fast field-cycling magnetic resonance imaging", Comptes Rendus—Physique, Elsevier, Paris, FR, vol. 11, No. 2, ISSN 1631-0705, (Mar. 1, 2010), pp. 136-148.
Nieminen et al., "Current-density imaging using ultra-low-field MRI with adiabatic pulses", Magnetic Resonance Imaging, Tarrytown, NY, US, (Oct. 15, 2013), vol. 32, No. 1, doi: 10.1016/j.mri.2013.07.012, ISSN 0730-725X, pp. 54-59.
Search Report issued on Sep. 12, 2022, in corresponding European Application No. 22305315.8, 9 pages.

* cited by examiner

LOW FIELD MAGNETIC RESONANCE IMAGING INSTRUMENTAL SYSTEM AND METHODS OF USE

FIELD

The invention concerns systems and methods for Magnetic Resonance Imaging—MRI. More particularly, the invention concerns low field MRI.

BACKGROUND

For anatomical and functional observations, high-field MRI is known and widely used. A reading magnetic field of more than 1.5 T makes this technique particularly efficient.

However, in recent years, it has been shown that MRI can be performed with a weak reading magnetic field, well below the 1.5 T, preferably around 50 μT (i.e. of the order of magnitude of the earth magnetic field). This technique is currently limited to research works, for example in metabolic and molecular imaging.

Since the Signal to Noise Ratio—SNR is proportional to the intensity of the reading magnetic field, the SNR is very low for low field MRI.

It is thus necessary to rise the available magnetization of the water protons of a sample by a pre-polarization step, before the reading step. With the pre-polarization step, the magnetization of the sample is higher and the SNR of the reading signal obtained with a weak reading magnetic field is improved. Similarly, the contrast of the low field MRI image is improved by a pre-polarization step.

Two types of pre-polarization processes are known: the magnetic pre-polarization and the dynamic pre-polarization.

The magnetic pre-polarization is carried out by applying, for a short period of time, a pre-polarization magnetic field of higher intensity than the reading magnetic field. Placed in a stronger magnetic field, the population of the spins of the water protons acquires a greater polarization, which will result in a higher reading signal.

The dynamic pre-polarization is based on a transfer of magnetization from the electrons of the molecules of a contrast agent injected into the sample, towards the water protons surrounding these molecules. This transfer of magnetization is initiated by the saturation of the electronic transition layer of the molecules of the contrast agent through the application of an intense electromagnetic wave, at a predefined resonance frequency $f_0$. Contrary to magnetic pre-polarization, this dynamic polarization technique can arise also during signal acquisition too, taking care of sufficient known techniques of frequency filtering.

These steps of pre-polarization (magnetic or dynamic) and signal reading follow precise rules.

Consequently, known low field MRI systems are specifically designed to perform these steps in a specific manner. In particular, a low field MRI system exhibits a dedicated geometry to perform a magnetic pre-polarization or a dynamic pre-polarization step. In addition, the geometry is also dedicated to perform the reading step adapted to the pre-polarization step chosen and how this pre-polarization step is carried out.

For example, the relatively high intensity required in the magnetic pre-polarization process has to be generated by one or several pre-polarization solenoid coil(s). However, this pre-polarization solenoid coil has to lay horizontally to allow the positioning of the sample inside the pre-polarization solenoid coil easily.

In addition, in order to maximize the reading signal at low reading magnetic field (and consequently at low frequency), it is recommended to use a reading solenoid coil, since such a coil maximizes the inductance and the filling factor.

But, to be able to place the sample inside the reading solenoid coil necessitates to align the long axis of the reading solenoid coil in a direction parallel to the long axis of the pre-polarization solenoid coil.

However, this requirement is in conflict with nuclear magnetic resonance principle, which implies that the transmitted and received electromagnetic Radio Frequency—RF field is always perpendicular to the direction of the reading magnetic field. Indeed, it would not be possible to position the antennas for the RF field in the proper direction taking into account the pre-polarization end reading solenoid coils.

In another example, it has been shown that a circularly polarized pre-polarization magnetic field increases the efficiency of the dynamic pre-polarization process, in particular when using this technique at ultra-low field. But such a magnetic field necessitates the use of a bird cage coil (or a similar coil with circular polarization capabilities), that can only be positioned horizontally to allow the sample to be easily positioned inside the bird cage coil. However, in order to carry out this circular polarization properly, it is then necessary that the main axis of the bird cage coil is aligned with the direction of a pre-polarization magnetic field that is beneficially created when the electronic saturation radiofrequency signal is applied.

SUMMARY

The invention therefore aims at a low field MRI instrumental system with a greater versatility in order to exhibits different operating modes without being limited to one particular setup of the pre-polarization and/or reading steps.

To this end, the subject-matter of the invention pertains to a low field Magnetic Resonance Imaging—MRI instrumental system for imaging a sample placed inside a hollow cylindrical volume through the low field MRI instrumental system, comprising: an electromagnetic Radio Frequency—RF antenna adapted to emit electromagnetic RF pulses for inducing Electron Paramagnetic Resonance—EPR; an electromagnetic Low Frequency—LF antenna for measurements, adapted to emit electromagnetic LF pulses for inducing Nuclear Magnetic Resonance—NMR, respectively to receive LF signal produce by NMR; a gradient generator, adapted to create a gradient in a static magnetic field generated during measurements; a high field generator adapted to generate, in the hollow cylindrical volume, a strong pre-polarization magnetic field for magnetic pre-polarization; and, a control/command unit, characterized in that the low field MRI instrumental system further comprises a low field unit adapted to generate, inside the hollow cylindrical volume, a low static magnetic field whose direction is adjustable in any direction in space, a fixed reference frame XYZ being associated with the low field MRI instrumental system so that the direction X coincides with a main axis of the hollow cylindrical volume through the low field MRI instrumental system.

The subject-matter of the invention also pertains to a method of use of the previous low field MRI instrumental system, said method comprises: a preparation step of energizing the high field generator to generate a strong static pre-polarization magnetic field along direction X of the fixed reference frame associated with the field MRI instrumental system; and then, a measurement step of controlling the low field unit in order to generate a low static magnetic field along direction Z, controlling the gradient generator to superimpose a reading and encoding low static magnetic field, and using the electromagnetic LF antenna to emit LR pulses and receive LR signals from a sample, the LF pulses being such that a dynamic magnetic field is generated along direction X.

BRIEF DESCRIPTION OF THE FIGURES

The invention and its advantages will be better understood upon reading the description which will follow, provided solely by way of example, with reference made to the accompanying drawings in which.

DEFINITIONS

The reading step involves a Nuclear Magnetic Resonance—NMR phenomenon.

The dynamic pre-polarization step involves an Electron Paramagnetic Resonance—EPR phenomenon.

B0_NMR refers to a static magnetic field for NMR.

B1_NMR refers to the Low Frequency magnetic Field for NMR.

B0_EPR refers to a static magnetic field for EPR.

B1_EPR refers to the Radio Frequency magnetic Field for EPR.

B_POL refers to a static field activated for magnetic pre-polarization.

DETAILED DESCRIPTION

Figure 1:
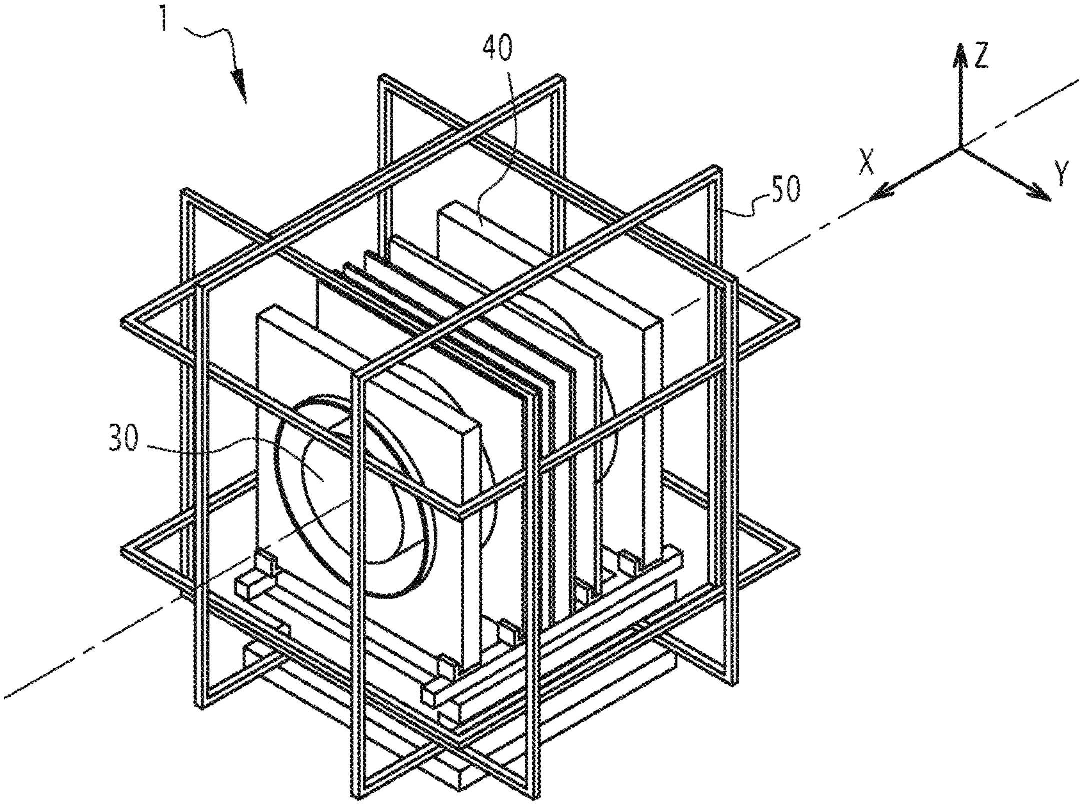
FIG. 1 is a perspective view of a preferred embodiment of the low field MRI instrumental system according to the invention.
Figure 2:
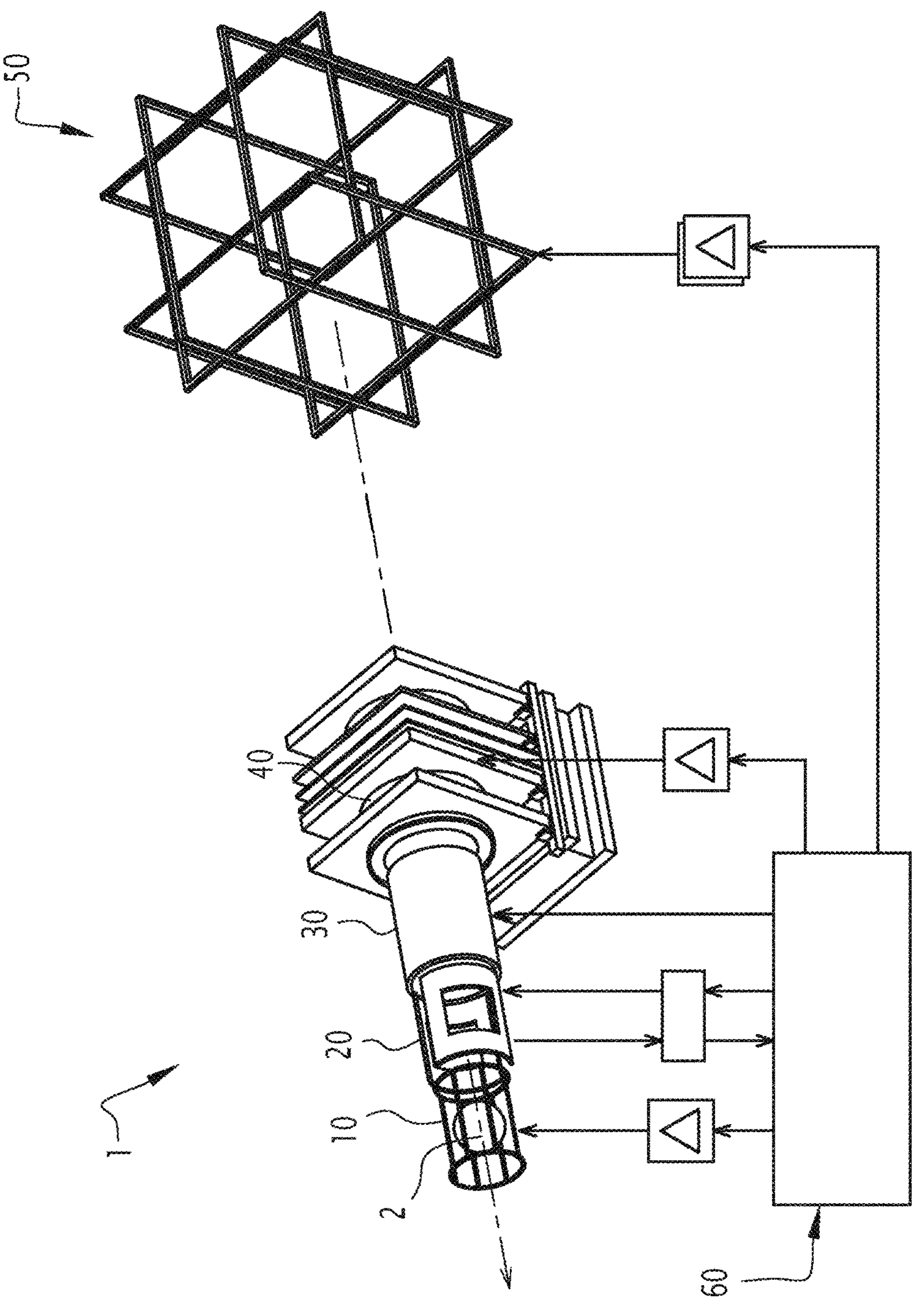
FIG. 2 is an exploded view of the low field MRI instrumental system according to FIG. 1.

As shown in FIGS. 1 and 2, the low field MRI instrumental system 1 according to the invention is capable of modifying the direction (in the three directions of space), and advantageously the intensity, of the magnetic fields during magnetization preparation and signal measurement.

A fixed frame of reference XYZ is attached to system 1. The Z direction is parallel to the vertical direction of the laboratory where system 1 is located. XY plan is thus a horizontal plane. The X direction is chosen as the longitudinal direction of the cylindrical hollow volume going through system 1. This hollow volume allows a sample 2 to be introduced along axis X into the low MRI instrumental system 1 so as to be placed inside an imaging predefined zone of view at the center of system 1.

The low field MRI instrumental system 1 comprises, from the inside to the outside thereof:

- an electromagnetic RF antenna 10: it is used to emit electromagnetic RF pulses for inducing EPR during dynamic pre-polarization steps. It is preferably constituted by coils known as "transverse-field coils", like a bird cage coil;
- an electromagnetic LF antenna 20: it is used to emit, respectively receive, electromagnetic LF pulses for inducing, respectively detecting, NMR during reading steps. It is preferably constituted by an axial field coil, based on solenoid;
- a gradient generator 30: it is used to create a gradient of the static magnetic field B0_NMR during the requested MRI encoding (slice selection, phase encoding or read-out as required by the acquisition sequence, not shown) during all the NMR sequence for different encoding purposes, including reading. It is preferably constituted by one or several coaxial coils with configurations that depends on the gradient directions;
- a high field generator 40: it is used to applied a relatively strong pre-polarization magnetic field during magnetic pre-polarization steps. It is preferably constituted by one or several coaxial solenoidal coils;
- a low field unit 50; and,
- a control/command unit 60.

Each individual component 10 to 40 is known as such and the present low field MRI instrumental system 1 is specific in that it comprises component 50 (control/command unit 60 being adapted to be able to control component 50 in addition to the other components).

The low field unit 50 is designed to be able to generate a static magnetic field B0, whose direction can be selected, through unit 60, in any direction and whose absolute intensity can be adjusted, through unit 60, from zero to a maximum value of, for example, 200 μT.

The low field unit 50 is made up of three sets of coils.

The first set of Helmholtz coils is designed and located to generate an elementary magnetic field along the X direction, the second set of Helmholtz coils is designed and located to generate an elementary magnetic field along the Y direction, and the third set of Helmholtz coils is designed and located to generate an elementary magnetic field along the Z direction.

Each set comprises at least one pair of Helmholtz coils. This particular embodiment is shown in the figures. To use several pairs of Helmholtz coils per set of coils, for example two pairs of Helmholtz coils, improves the homogeneity of the elementary magnetic field generated by this set of coils.

Each coil of a pair of coils is preferably square shaped. The two coils of a pair of coils are positioned symmetrically one form the other relative to a median plane of system 1, orthogonal to the direction of the elementary magnetic field generated by this pair of coils.

The elementary magnetic field generated by one pair of Helmholtz coils is homogeneous at least inside the zone of view where the sample to be imaged is placed.

Each set of Helmholtz coils is thus positioned orthogonal to the two other pairs of Helmholtz coils.

The magnetic field B0 is the combination of the elementary magnetic fields generated by each set of coils.

Through the control of the intensity and the direction of the current flowing through each pairs of Helmholtz coils, it is possible to build up any magnetic field B0 in terms of direction and/or intensity, at least in the zone of view.

Methods

First Operating Mode

Figure 3:
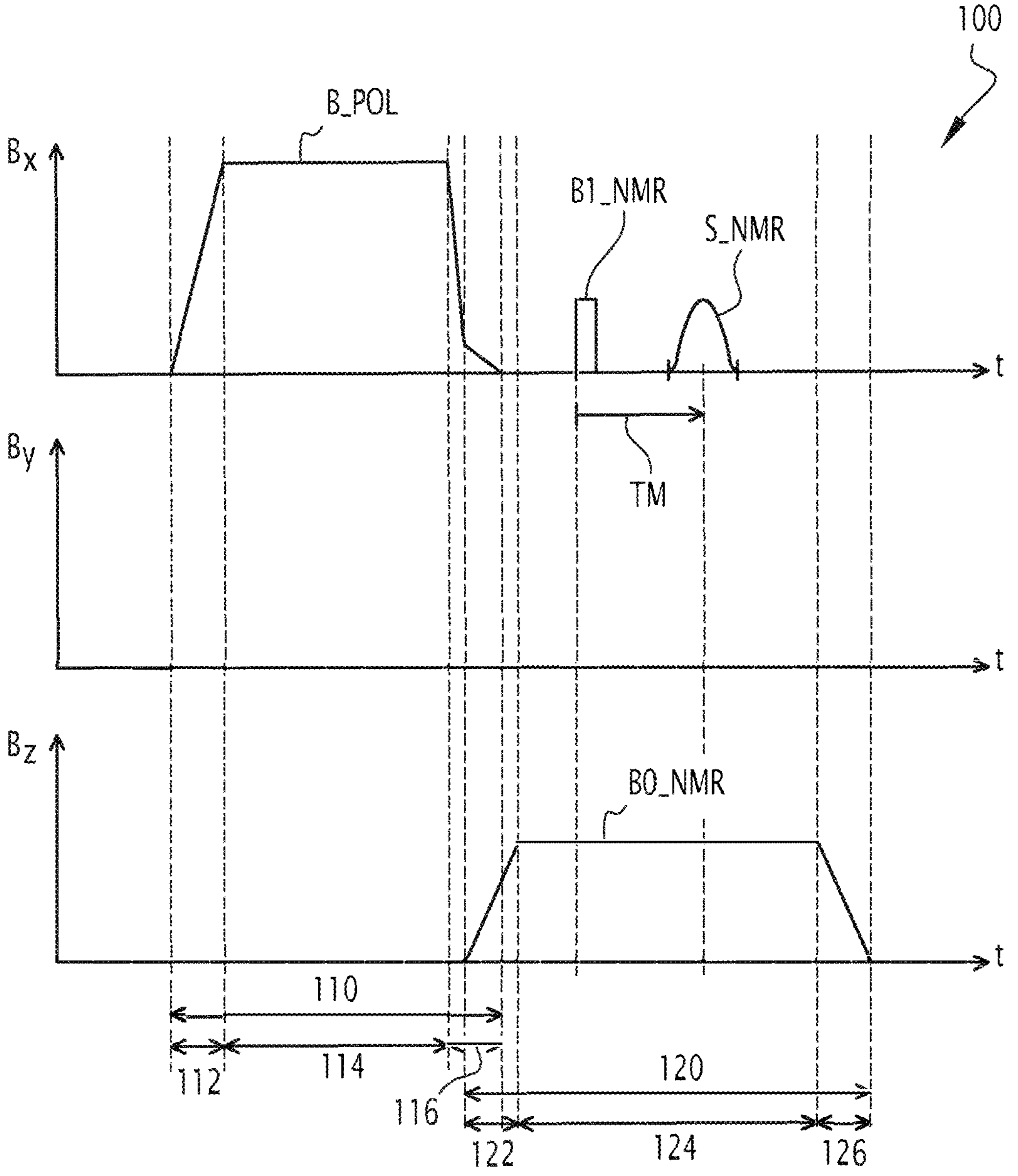
FIG. 3 is a first operating mode of the MRI instrumental system according to FIG. 1.

As shown in FIG. 3, a first operating mode 100 of the low field MRI instrumental system 1 involves a magnetic pre-polarization process. This process consists in applying a strong static magnetic field (called pre-polarization magnetic field B_POL) in order to align the proton spins of the water contained in the sample preferentially along the direction of this pre-polarization magnetic field B_POL. Then, the pre-polarization magnetic field is switched off and the MRI measurement process takes place.

More specifically, FIG. 3 represents the time evolution of the intensity of the three components of the total magnetic field B in the zone of view, respectively $B_X$, $B_Y$ and $B_Z$.

The first operating mode 100 comprises a first step 110 for the preparation of the sample.

A pre-polarization magnetic field B_POL is generated by the high field generator 40. It is aligned with direction X, i.e. the axis of the hollow volume through system 1.

During a first sub-step 112, the solenoid coil of generator 40 is energized to bring the intensity of B_POL from zero to its target value, for example 20 mT.

During a second sub-step 114, the intensity of BPOL is maintained at its target value.

Finally, during a third sub-step 116, the solenoid coil of generator 40 is de-energized to bring the intensity of BPOL back to zero. This step may be divided into two periods: in the first period, a rapid ramp down is applied to bring B_POL from its target value to a very low field level value, i.e. 1 mT; then, in the second step, the decay of B_POL is slowed down to allow an adiabatic re-orientation of the magnetization from direction of B_POL during the pre-polarization step to the direction of B0_NMR during the reading step.

This first step spans during a pre-polarization time of for example 3 s.

Then, the first operating mode 100 comprises a second step 120.

It consists in imaging the sample in a low magnetic field.

A static magnetic field B0_NMR is generated by low field unit 50 along direction Z.

More specifically, during first sub-step 122, unit 50 is energized to bring the intensity of B0_NMR from zero to its target value, for example of 205 μT.

During a second sub-step 124, the magnitude of B0_NMR is maintained constant at its target value.

At that time, the gradient generator 30 is controlled by unit 60 to superimpose magnetic components to the magnetic field B0_NMR for two or three dimension encoding for imaging purposes. In particular, a component along direction Z is added to get a reading magnetic field whose intensity in a point of the zone of view is specific to that point and other directional components During this sub-step, one or several MRI measurements are performed iteratively. To this end, the electromagnetic LF antenna 20 is controlled by unit 60 to emit pulses and receive the response of the sample.

Each pulse is such that a dynamic magnetic field B1_NMR is generated along direction X with a frequency of for example around 8730 Hz at 205 μT. After a duration TM, the response of the sample S_NMR to this pulse is also along direction X.

Finally, during third sub-step 126, the unit 50 is de-energized to bring the intensity of field B0_NMR back to zero.

This second step spans during a measurement time of for example 3 s.

First and second steps are iterated with a repetition time TR.

Advantageously, the sub-steps 116 and 122 are overlapping. The duration of each of these steps (also called field switching time) is of the order of 100 ms.

Advantageously, during both the first and second steps, unit 50 is controlled in order to generate a cancellation magnetic field, opposite the earth magnetic field so that this latter is totally cancelled.

Second Operating Mode

Figure 4:
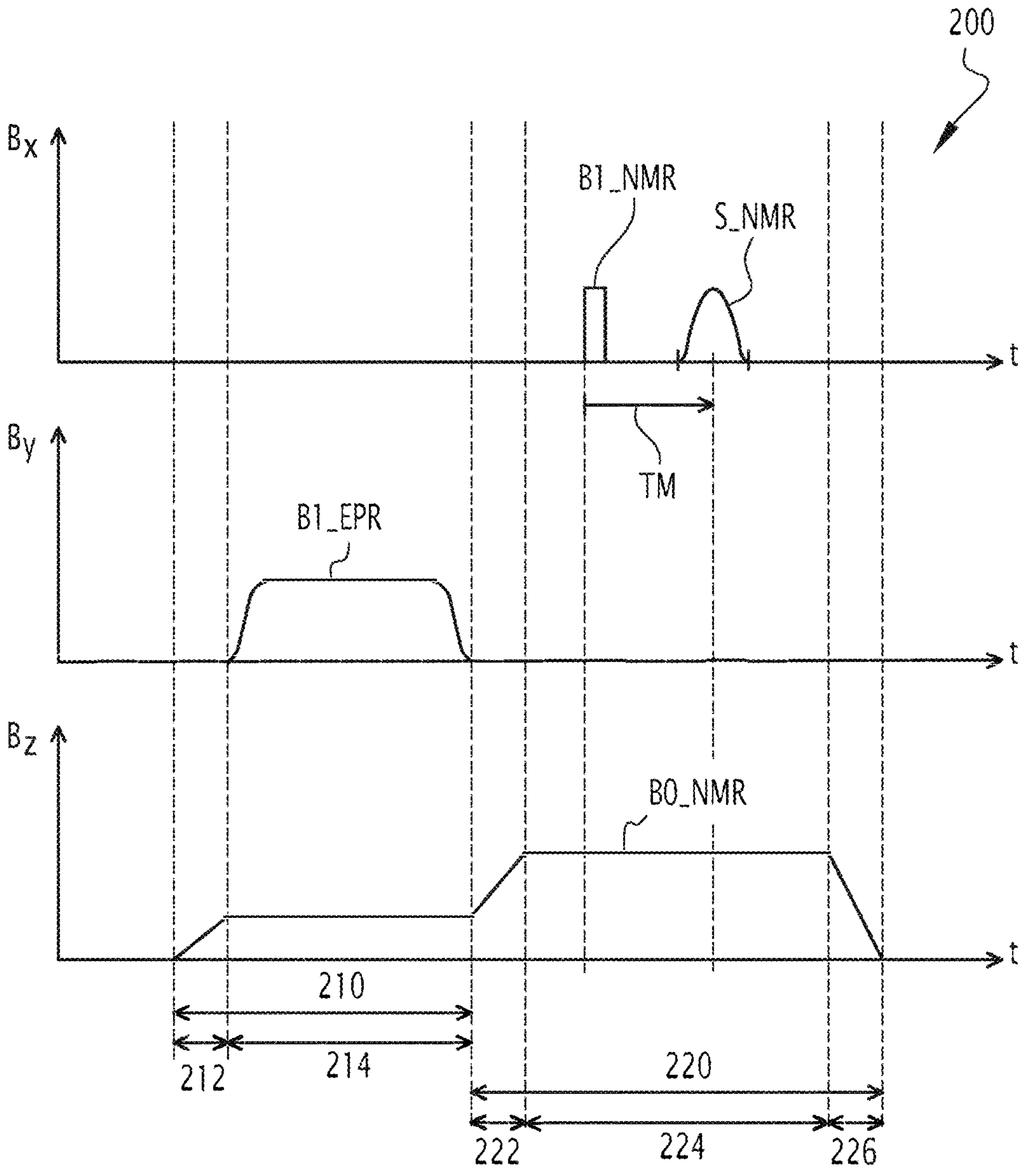
FIG. 4 is a second operating mode of the low field MRI instrumental system according to FIG. 1; and, FIG. 5 is a third operating mode of the low field MRI instrumental system according to FIG. 1.

As shown in FIG. 4, in solid line, a second operating mode 200 of the low field MRI instrumental system 1 involves a dynamic nuclear polarization process under a linear polarized electromagnetic field.

The dynamic nuclear polarization process consists in applying a pre-polarization electromagnetic field in order to saturate the electronic spins transitions of the molecules of a contrast agent injected in the sample. Then, through the coupling between electronic spins and proton spins, the proton spins polarization of the water protons (1H) of the sample increases under the influence of the strong electron spin polarization. The frequency of the pre-polarization electromagnetic field for the electron irradiation depends on coupling constants of the molecules and the applied B0_EPR magnetic field. Then the pre-polarization magnetic field is switched off and the IMR measures take place.

More specifically, the second operating mode 200 comprises a first step 210.

A static pre-polarization magnetic field B0_EPR is generated by unit 50. It is aligned with direction Z.

During the first sub-step 212, the unit 50 is energized to bring the intensity of B0_EPR from zero to a first target value, for example 45 μT.

During a second sub-step 214, the intensity of B0_EPR is maintained constant at its first target value, while a dynamic pre-polarization magnetic field B1_EPR is generated along direction Y by EPR pulses generated by the electromagnetic RF antenna 10. This operational mode is suitable for contrast agents having unpaired electrons, like nitroxides molecules, for example for Biomedical Overhauser Magnetic Resonance Imaging—OMRI purposes, using radiofrequencies ranging from 1 MHz to 300 MHz at least, with adapted RF antenna design.

This first step spans during a polarization time of for example 3 s.

Then, the second operating mode 200 comprises a second step 220.

It consists in imaging the sample in a low magnetic field.

During a first sub-step 222, unit 50 is energized to build up the intensity of the static magnetic field B0_NMR along direction Z. Unit 50 brings the magnitude of the static magnetic field B0 from its first target value at the end of the first step 210 (45 μT) to a second target value, for example of 205 μT. The direction of the static magnetic field B0 is thus unchanged between the first and second steps.

During a second sub-step 224, the magnitude of B0_NMR is maintained constant at its second target value.

The gradient generator 30 is controlled by the unit 60 to superimpose magnetic components to the magnetic field B0_NMR to get suitable encoding and reading magnetic fields.

During this sub-step, one or several MRI measurements take place. To this end, the electromagnetic LF antenna 20 is controlled by unit 60 to emit pulses B1_NMR and receive the corresponding responses S_NMR of the sample.

The pulses are such that a dynamic magnetic field B1_NMR is generated along direction X with a frequency of for example around 8730 Hz at 205 μT.

Finally, during a third sub-step 226, the unit 50 is de-energized to bring the intensity of B0_NMR back to zero.

This second step spans during a measurement time of for example 3 s.

First and second steps are iterated with a repetition time TR.

Advantageously, during both the first and second steps, unit 50 is operated so as to generate a cancellation magnetic field opposite the earth magnetic field so that this latter is cancelled.

In this second operating mode there is no modification of the direction of the static magnetic field used both for pre-polarization B0_EPR, and for measurement, B0_NMR.

As an alternative to this second operating mode, not shown in the figures, the first and second steps are merged.

More specifically, during the first sub-step of the first step, the unit 50 is energized to bring the intensity of the static field along the Z direction from zero to a target value B0 for performing EPR.

During a second sub-step, the intensity of the static field along the Z direction is maintained at B0, while the dynamic pre-polarization magnetic field B1_EPR is generated along direction Y.

Then the second step is preformed while keeping both the static field along the Z direction to the target value B0 for performing MNR and dynamic pre-polarization magnetic field B1_EPR. To be able to perform the MNR without modifying the intensity of the static magnetic field means that B0 high, around 205 μT.

The imaging of the sample in a low magnetic field can then be started immediately. One or preferably several successive MRI measurements take place by controlling the electromagnetic LF antenna 20. Successive pulses of dynamic magnetic field along direction X, B1_NMR, are emitted and the response, S_NMR, associated with each pulse is received.

Finally, once the signal for each required encoding steps making up the image is acquired, the unit 50 can be de-energized to bring the intensity of B0 field back to zero.

According to this alternative, the iteration of the successive measures for imaging the sample is performed without having to also reiterate the first step.

This operative mode is relevant for 3D acquisitions, since it is the only way to acquire images with a high resolution the resolution. This improvement of the image resolution is unreachable by other means. This operative mode is also time efficient, what is advantageous for imaging with a high resolution.

In addition, the static field to perform the EPR is stronger, helps overcoming the crosstalk between opposite transistions in the EPR spectrum thus improving the contrast of the final image.

Finally, for passing from the first step to the second step, unit 50 does not need to be energized to build up the intensity of the static magnetic field along direction Z and associated time steps are cancelled, reducing the total time of the TR loop (acquisition loop).

Third Operating Mode

Figure 5:
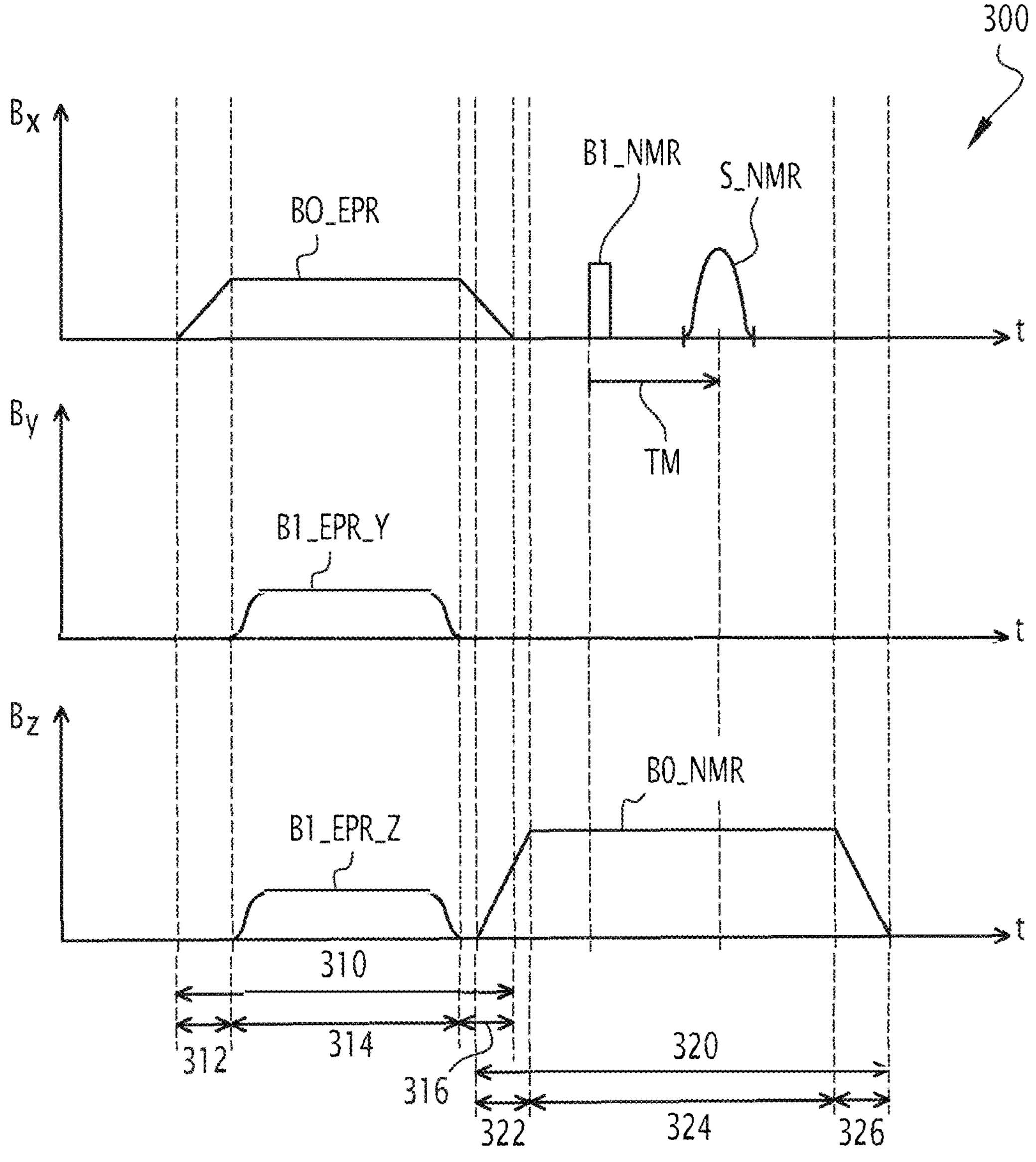

As shown in FIG. 5, a third operating mode 300 of the low field MRI instrumental system 1 also involves a dynamic pre-polarization process, but performed under a circular polarized electromagnetic field.

More specifically, the third operating mode comprises a first step 310.

A static pre-polarization magnetic field B0_EPR is generated by unit 50, but this time this static magnetic field is directed along direction X.

During a first sub-step 212, the unit 50 is energized to bring the intensity of B0_EPR from zero to its target value, for example 45 μT.

During a second sub-step 214, the intensity of B0_EPR is maintained constant at its target value, while a dynamic pre-polarization magnetic field B1_EPR is generated. Field B1_EPR is created by the electromagnetic RF antenna 10 emitting EPR pulses.

The dynamic pre-polarization magnetic field B1_EPR is generated so that it has a component B1_EPR_Y along direction Y and a component B1_EPR_Z along direction Z.

The pulses are controlled to have a phase difference of 90° between the Z and Y components so that the dynamic field B1_EPR turns in the ZY plane, i.e. the plane orthogonal to the direction of the static field B0_EPR. B1_EPR thus is circularly polarized.

This operational mode is suitable for contrast agents having unpaired electrons, like nitroxides molecules, for OMRI purposes, using radiofrequencies ranging from 1 MHz to 300 MHz at least, with adapted RF antenna design.

Finally, during a third sub-step 316, unit 50 is de-energized to bring the intensity of the static field B0_EPR back to zero.

This first step spans during a polarization time of for example 3 s.

The third operating mode comprises a second step 320 similar to the reading step 220 of the second operative mode.

It consists in imaging the sample in a low magnetic field.

During a first sub-step 322, unit 50 is energized to build up the intensity of the static magnetic field B0_NMR along direction Z. Unit 50 brings the magnitude of the static magnetic field B0 from its value at the end of the first step 210 (45 μT) to its target value, for example of 205 μT, while modifying the orientation of the direction of this static magnetic field B0 from direction X to direction Z.

During a second sub-step 324, the magnitude of B0_NMR is maintained constant at its target value.

The gradient generator 30 is controlled by the unit 60 to superimpose a magnetic component to the static magnetic field B0_NMR to get a suitable reading magnetic field as previously described.

During this sub-step, one or several MRI measurements take place. To this end, the electromagnetic LF antenna 20 is controlled by unit 60 to emit LF pulses and receive the corresponding responses from the sample.

The LF pulses are such that a dynamic magnetic field B1_NMR is generated along direction X with a frequency of around 8730 Hz at 205 μT.

Finally, during a third sub-step 326, the unit 50 is de-energized to bring the intensity of the static field B0_NMR back to zero.

This second step spans during a measurement time of for example 3 s.

First and second steps are iterated with a repetition time TR.

Advantageously, during both the first and second steps, unit 50 is operated in order to generate a cancellation magnetic field that is opposite to the earth magnetic field to cancel this latter.

Advantageously, the sub-step 316 and 322 are overlapping. This field switching time is of the order of 100 ms. The field switching is preferably adiabatic and the magnetization vector of the sample rotates according to the resulting static field orientation.

In this third operating mode, there is a modification of the direction of the static magnetic field between the pre-polarization step and the measurement step.

Alternatives and Advantages

Other operating modes of the system according to the invention may be encompassed by the person skilled in the art.

For example, the static magnetic field in the reading step could be oriented along direction Y rather than direction Z.

In another example, rather than kept constant during the reading step, the value of the static magnetic field may be changed, for example, by stages, one or more measures taking place at each stage.

The low field MRI instrumental system is very versatile in its uses, since it is provided with a plurality of sets of coils allowing the selection and the setup of the direction and intensity of the static magnetic field.

In an alternative embodiment, the system is provided with a first set of pairs of Helmholtz coils for generating a first component of the static magnetic field parallel to the main axis of the system (i.e. the axis of the hollow volume through the system for sample insertion) and a second set of pairs of Helmholtz coils generating a second component perpendicular to the main axis of the system.

The invention claimed is:

1. A low field Magnetic Resonance Imaging (MRI) instrumental system for imaging a sample placed inside a hollow cylindrical volume through the low field MRI instrumental system, comprising:

- an electromagnetic Radio Frequency—(RF) antenna adapted to emit electromagnetic RF pulses for inducing Electron Paramagnetic Resonance—EPR;
- an electromagnetic Low Frequency—(LF) antenna (20) for measurements, adapted to emit electromagnetic LF pulses for inducing Nuclear Magnetic Resonance—(NMR), respectively to receive LF signal produced by NMR;
- a gradient generator, adapted to create a gradient in a static magnetic field generated during measurements;
- a high field generator adapted to generate, in the hollow cylindrical volume, a strong pre-polarization magnetic field for magnetic pre-polarization; and,
- a control/command unit, wherein the low field MRI instrumental system further comprises a low field unit adapted to generate, inside the hollow cylindrical volume, a low static magnetic field whose direction is adjustable in any direction in space, a fixed reference frame XYZ being associated with the low field MRI instrumental system so that the direction X coincides with a main axis of the hollow cylindrical volume through the low field MRI instrumental system, wherein the strong pre-polarization magnetic field is of higher intensity than the low static magnetic field.

2. The low field MRI instrumental system according to claim 1, wherein the low field unit is adapted to adjust an absolute intensity of the low static magnetic field within a predefined range.

3. The low field MRI instrumental system according to claim 2, wherein the predefined range spans from zero to a maximum value of 500 μT.

4. The low field MRI instrumental system according to claim 1, wherein the low field unit is adapted to cancel an earth magnetic field at any operating time of the low field MRI instrumental system.

5. The low field MRI instrumental system according to claim 1, wherein a current operating mode of the low field MRI instrumental system is selected between a plurality of possible operating modes comprising at least an operating mode involving a magnetic pre-polarization and an operating mode involving a dynamic pre-polarization.

6. The low field MRI instrumental system according to claim 5, wherein the plurality of operating modes of the low field MRI instrumental system further comprises an operating mode involving a linear polarized dynamic pre-polarization and an operating mode involving a circular polarized dynamic pre-polarization.

7. The low field MRI instrumental system according to claim 1, wherein the low field unit comprises three orthogonal sets of coils, each set of coils being adapted to generate a component of the static magnetic field along a corresponding direction of the fixed reference frame associated with the low field MRI instrumental system, and each set of coils comprising at least one pair of Helmholtz coils.

8. A method of use of the low field MRI instrumental system according to claim 1, said method comprising:

- a preparation step of energizing the high field generator to generate a strong static pre-polarization magnetic field (B_POL) along direction X of the fixed reference frame associated with the low field MRI instrumental system; and then,
- a measurement step of controlling the low field unit in order to generate a low static magnetic field (B0_NMR) along direction Z, controlling the gradient generator to superimpose a reading and encoding low static magnetic field, and using the electromagnetic LF antenna to emit LF pulses and receive LF signals from a sample, the LF pulses being such that a dynamic magnetic field (B1_NMR) is generated along direction X.

9. A method of use of the low field MRI instrumental system according to claim 1 comprising:

- a preparation step of controlling the low field unit in order to generate a static pre-polarization magnetic field (B0_EPR) along direction Z, and controlling the electromagnetic RF antenna to emit RF pulses, the RF pulses being such that a dynamic pre-polarization magnetic field (B1_EPR) is generated along direction Y, the dynamic pre-polarization magnetic field (B1_EPR) having a linear polarization; and then,
- a measurement step of controlling the low field unit in order to generate a low static magnetic field (B0_NMR) along direction Z, controlling the gradient generator to superimpose reading and encoding pulsed magnetic fields, and using the electromagnetic LF antenna to emit LF pulses and receive the LF signal from the sample, the LF pulses being such that a dynamic magnetic field (B1_NMR) is generated along direction X.

10. A method of use of the low field MRI instrumental system according to claim 1, comprising:

- a preparation step of controlling the low field unit in order to generate a static pre-polarization magnetic field (B0_EPR) along direction X, and controlling the electromagnetic RF antenna to emit RF pulses, the RF pulses being such that a dynamic pre-polarization magnetic field (B1_EPR) is generated with a Y component along direction Y and a Z component along direction Z, the Z and Y components being phase shifted one from the other at 90°, the dynamic pre-polarization magnetic field (B1_EPR) having a circular polarization; and then,
- a measurement step of controlling the low field unit in order to generate a low static magnetic field (B0_NMR) along a Z direction, controlling the gradient generator to superimpose reading and encoding pulsed magnetic fields, and using the electromagnetic LF antenna (20) to emit LF pulses and receive the LF signals from the sample, the LF pulses being such that a dynamic magnetic field (B1_NMR) is generated along direction X.

* * * * *